(12) United States Patent
Yoshitake

(10) Patent No.: US 8,399,833 B2
(45) Date of Patent: Mar. 19, 2013

(54) CHARGED PARTICLE BEAM WRITING METHOD, METHOD FOR DETECTING POSITION OF REFERENCE MARK FOR CHARGED PARTICLE BEAM WRITING, AND CHARGED PARTICLE BEAM WRITING APPARATUS

(75) Inventor: Shusuke Yoshitake, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 502 days.

(21) Appl. No.: 12/722,922

(22) Filed: Mar. 12, 2010

(65) Prior Publication Data

US 2010/0237256 A1 Sep. 23, 2010

(30) Foreign Application Priority Data

Mar. 18, 2009 (JP) ................. 2009-067030

(51) Int. Cl.
*H01J 37/244* (2006.01)
(52) U.S. Cl. ........... 250/307; 250/252.1; 250/492.22
(58) Field of Classification Search ........... 250/307, 250/306, 491.1, 252.1, 492.22
See application file for complete search history.

(56) References Cited

U.S. PATENT DOCUMENTS

| | | | |
|---|---|---|---|
| 5,209,813 A | 5/1993 | Oshida et al. | |
| 6,335,532 B1 * | 1/2002 | Tanaka et al. | 250/491.1 |
| 7,692,144 B2 * | 4/2010 | Watanabe et al. | 250/307 |
| 2006/0234135 A1 | 10/2006 | Hau-Riege et al. | |
| 2008/0318138 A1 | 12/2008 | Holfeld | |
| 2009/0309022 A1 | 12/2009 | Gunji et al. | |

FOREIGN PATENT DOCUMENTS

JP   2004-289110   10/2004

OTHER PUBLICATIONS

Office Action issued Jun. 14, 2011, in German Patent Application No. 10 2010 011 155.4 (with English translation).

* cited by examiner

*Primary Examiner* — Kiet T Nguyen
(74) *Attorney, Agent, or Firm* — Oblon, Spivak, McClelland, Maier & Neustadt, L.L.P.

(57) ABSTRACT

The reference mark has steps and is formed on a sample. A stage moves in X and Y directions. The sample M is placed on the stage. An optical lever type height position sensor emits light to detect the reference mark FM' by the stage being scanned. The spot position of light reflected on the sample is detected in position sensitive detector. The X and Y coordinates of the position of the stage positioned when the spot position of the reflected light is changed is detected. The detected X and Y coordinates are regarded as the position C of the reference mark FM'. The position of a phase defect D located in the sample M is specified on the basis of the position C of the reference mark FM'. The position of a portion on which writing is to be performed is determined on the basis of a relationship with the specified position of the phase defect D.

6 Claims, 7 Drawing Sheets

CHARGED PARTICLE BEAM WRITING METHOD, METHOD FOR DETECTING POSITION OF REFERENCE MARK FOR CHARGED PARTICLE BEAM WRITING, AND CHARGED PARTICLE BEAM WRITING APPARATUS

BACKGROUND OF THE INVENTION

1. Field of the Invention

The present invention relates to a charged particle beam writing method, a method for detecting the position of a reference mark for charged particle beam writing, and a charged particle beam writing apparatus.

2. Background Art

Semiconductor devices are being further shrunk in size. Along with such a trend, extreme ultraviolet (EUV) lithography has attracted attention in recent years. In the extreme ultraviolet lithography, extreme ultraviolet light is used as exposure light. Since the wavelength of the EUV light is as short as 13.5 nanometers, it is expected that a resolution in use will be enhanced. However, a mask material through which the EUV light can be transmitted without attenuation has not been found. Thus, not a transmissive mask but a reflective mask is typically used to perform the EUV lithography (refer to Japanese Patent Laid-open No. 2004-289110). The reflective mask has a multilayer film and an absorber pattern. The multilayer film is formed on the surface of a substrate and reflects light. The absorber pattern is formed on the multilayer film and absorbs light. In a process for forming the reflective mask, if an environmental contaminant is mixed into the multilayer film or the multilayer film is formed on an irregularity located on the surface of the substrate, then the ordered structure of the multilayer film may be disordered, resulting in the multilayer film having a phase defect. When light (such as the EUV light) having a short wavelength is used as exposure light, a phase defect may occur and affect exposure irrespective of an extremely small irregularity.

There is a known method for shifting the position of a portion, on which writing is to be performed, of the absorber pattern so that the phase defect is hidden under the absorber. In the method, a defect detection apparatus detects the position of the phase defect located in the multilayer film before the absorber is formed. Specifically, the position of the phase defect is detected on the basis of the position of a reference mark formed in the multilayer film. After that, the absorber and a resist are formed on the multilayer film. To write a pattern on the resist, the position of the reference mark is detected and the position of the phase defect is determined on the basis of the detected position of the reference mark. Then, a pattern is written on the resist so that the phase defect is covered with the absorber. For that reason, the position of the reference mark needs to be detected before the pattern is written by an electron beam writing apparatus.

The multilayer film is formed by alternately laminating silicon (Si) films and molybdenum (Mo) films. The multilayer film includes 40 to 50 films. When a predetermined portion of the surface of the multilayer film is irradiated with laser light, the Si film(s) and the Mo film(s) react in the predetermined portion to form a molybdenum silicide (MoSi) film. In this case, since the volume of the formed MoSi film is reduced compared with the total volume of the Si film(s) and the Mo film(s), a step portion having a height of 50 to 60 nm is formed between the surface of the multilayer film and the surface of the MoSi film, where a concave reference mark is formed.

There is a known method for detecting the position of the thus formed reference mark by means of an electron beam writing apparatus. In the known method, an electron gun emits an electron beam to scan the reference mark, and the position of the reference mark is detected on the basis of the waveform of a signal of an electron reflected on the reference mark.

Since a semiconductor process such as a lithographic process or an etching process is not used in forming the reference mark, the reference mark has a large roughness (edge roughness) on its edge. In addition, the electron beam has a very small spot diameter. Thus, the signal waveform of the electron reflected when the electron beam is scanned over the reference mark is affected by the edge roughness. When the spot of the electron beam is slightly shifted from the reference mark, a profile of the signal waveform of the reflected electron is changed, and thereby the position of the reference mark may not be reproducibly detected.

SUMMARY OF THE INVENTION

Objects of the present invention are to provide a charged particle beam writing method, a method for detecting the position of a reference mark for charged particle beam writing, and a charged particle beam writing apparatus, which are capable of reproducibly detecting the position of a reference mark without an influence of an edge roughness of the stepped reference mark that is formed on a sample.

According to one aspect of the present invention, in a charged particle beam writing method, a stage is moved in X and Y directions. The stage is scanned against light emitted by an optical lever type height position sensor over a reference mark that has steps and is formed in a sample placed on the stage. A change in the angle of light reflected on the sample is detected. X and Y coordinates of the position of the stage positioned when the angle of the reflected light is changed, are detected. The position of the reference mark is calculated on the basis of the detected positional coordinates. On the basis of the calculated position of the reference mark, the position of a defect located in the sample is specified. On the basis of a relationship with the specified position of the defect, the position of a portion on which writing is to be performed, is determined.

According to one aspect of the present invention, in a method for detecting the position of a reference mark for charged particle beam writing, the reference mark having steps and being formed in a sample placed on a stage included in a charged particle beam writing apparatus, the stage is moved in X and Y directions. The stage is scanned against light emitted by an optical lever type height position sensor over the reference mark. A change in the angle of light reflected on the sample is detected. X and Y coordinates of the position of the stage positioned when the angle of the reflected light is changed, are detected. The position of the reference mark is detected on the basis of the detected X and Y coordinates.

According to other aspect of the present invention, a charged particle beam writing apparatus that irradiates, with a charged particle beam, a sample placed on a stage capable of moving in X and Y directions, comprises a stage position detector that detects X and Y coordinates of the position of the stage, a detector to capture the spot position of reflected light that emits light to the sample placed on the stage and detects a change in the angle of light reflected on the sample, and a reference position detector that calculates X and Y coordinates of the position of the stage positioned when the angle of the reflected light is changed by the movement of the stage in the X and Y directions and that detects, on the basis of the calculated X and Y coordinates, the reference position of a portion on which writing is to be performed.

DETAILED DESCRIPTION OF THE EMBODIMENTS

An embodiment of the present invention is described below in detail.

Figure 1:
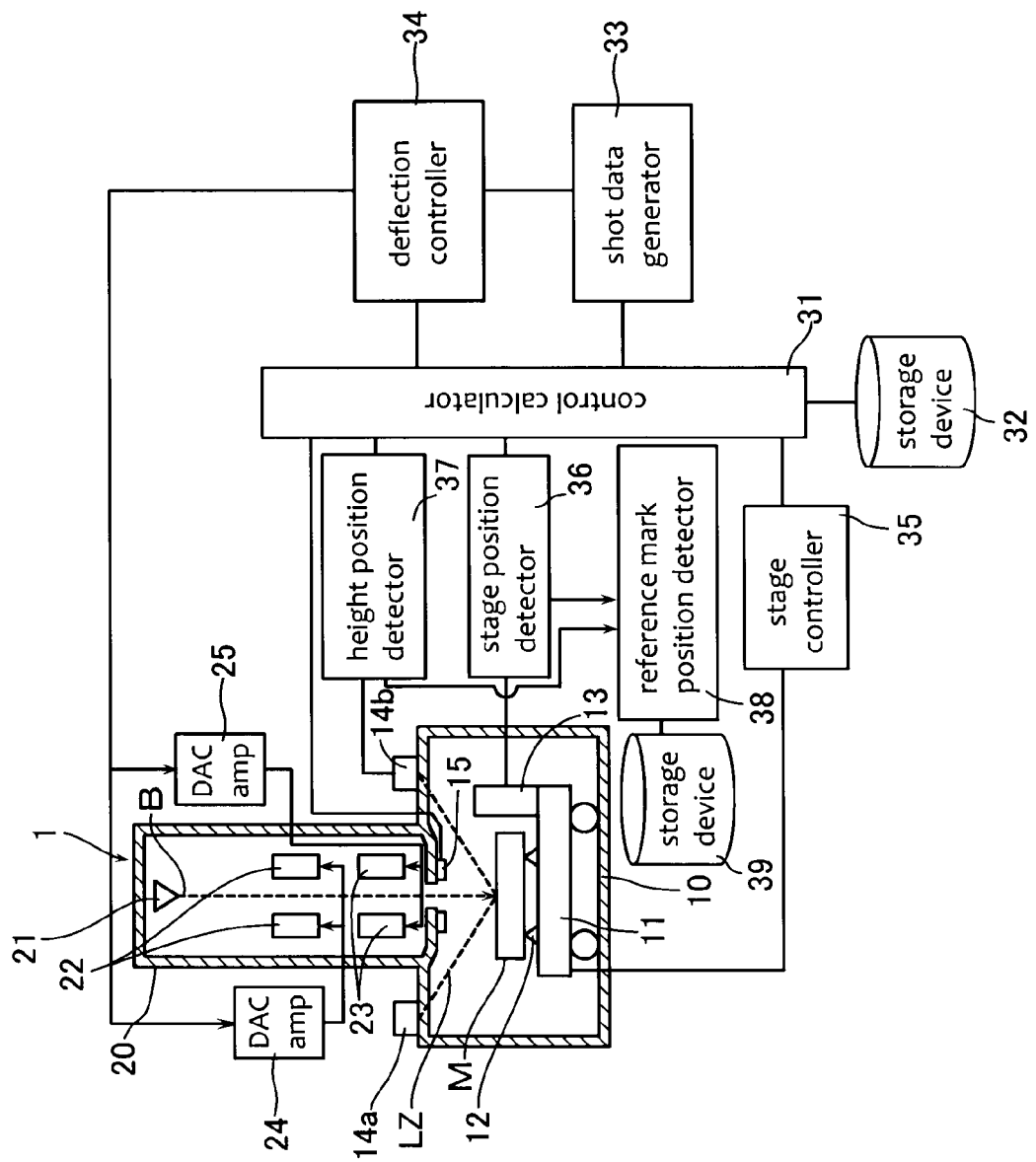
FIG. 1 is a schematic view showing the configuration of an electron beam writing apparatus according to the embodiment of the present invention.

FIG. 1 is a schematic view showing the configuration of an electron beam writing apparatus according to the embodiment of the present invention. The electron beam writing apparatus has a writing apparatus body 1. The writing apparatus body 1 has a writing chamber (also called a sample chamber) 10 and a lens barrel of electron optical system 20. The lens barrel of electron optical system 20 is provided above the writing chamber 10.

A stage 11 is located in the writing chamber 10. The stage 11 is capable of moving in X and Y directions with a mask M or sample placed thereon. The stage 11 has a holding member 12 on its front surface. The holding member 12 holds a back surface of the mask M.

A reflective mirror 13 is located near an edge portion of the stage 11. The reflective mirror 13 is used to measure the position of the stage 11. A stage controller 35 controls the stage 11 to cause the stage 11 to move. A stage position detector 36 detects the position (in the X and Y directions) of the stage 11. The stage position detector 36 has a laser interferometer or the like.

An optical lever type Height sensor 14 is provided diagonally above the mask M. The Height sensor 14 includes a light emitting section 14a and a light receiving section 14b. The light emitting section 14a emits laser light LZ to the mask M. The light receiving section 14b receives light reflected on the surface of the mask M. A light emitting element may be used as the light emitting section 14a. A position sensitive detector may be used as the light receiving section 14b. A light signal received by the light receiving section 14b is input to a height position detector 37 that is an example of a position sensitive detector to capture the spot position change. The height position detector 37 detects the height position of the surface of the mask M on the basis of the received light signal. In the present embodiment, the Height sensor 14 and the height position detector 37 are used to detect the position of a reference pattern FM' (described later).

A reflected electron detector 15 is provided above the mask M. The reflected electron detector 15 detects an electron reflected on the mask M after the mask M is irradiated with an electron beam B.

The lens barrel of electron optical system 20 includes an electron gun 21, a main deflector 22 and an sub deflector 23. The deflectors 22 and 23 are provided for beam scanning. The lens barrel of electron optical system 20 also includes lenses, a blanking deflector, an aperture for beam shaping, and a deflector for beam shaping (not illustrated). The main deflector 22 deflects the electron beam B to ensure that the electron beam B propagates to a predetermined subfield (sub deflection region). The sub deflector 23 deflects the electron beam B to ensure that the electron beam B propagates to a pattern located in the subfield.

The main deflector 22 is connected to a DAC amplifier 24. The DAC amplifier 24 converts a main deflection signal transmitted from a deflection controller 34 (described later) into an analog signal and amplifies the converted signal. The sub deflector 23 is connected to a DAC amplifier 25. The DAC amplifier 25 converts a sub deflection signal transmitted from the deflection controller 34 into an analog signal and amplifies the converted signal.

The electron beam writing apparatus shown in FIG. 1 includes a control calculator 31. The control calculator 31 controls the entire electron beam writing apparatus. The control calculator 31 is connected to a storage device 32 (that is a magnetic disk device or the like), a shot data generator 33, the defection controller 34, the stage controller 35, the stage position detector 36, and the height position detector 37 through buses.

The storage device 32 stores write data necessary for writing that is performed on an LSI. The position and shape of a pattern are defined in the write data. The shot data generator 33 reads, from the storage device 32, write data necessary for writing a predetermined write stripe region. The shot data generator 33 generates shot data formed by dividing, on the basis of a shot unit, a pattern defined in the read write data. The deflection controller 34 generates a main deflection signal on the basis of the shot data generated by the shot data generator 33. The main deflection signal is used to control the main deflector 22. In addition, the deflection controller 34 generates an sub deflection signal that is used to control the sub deflector 23.

Figure 2:
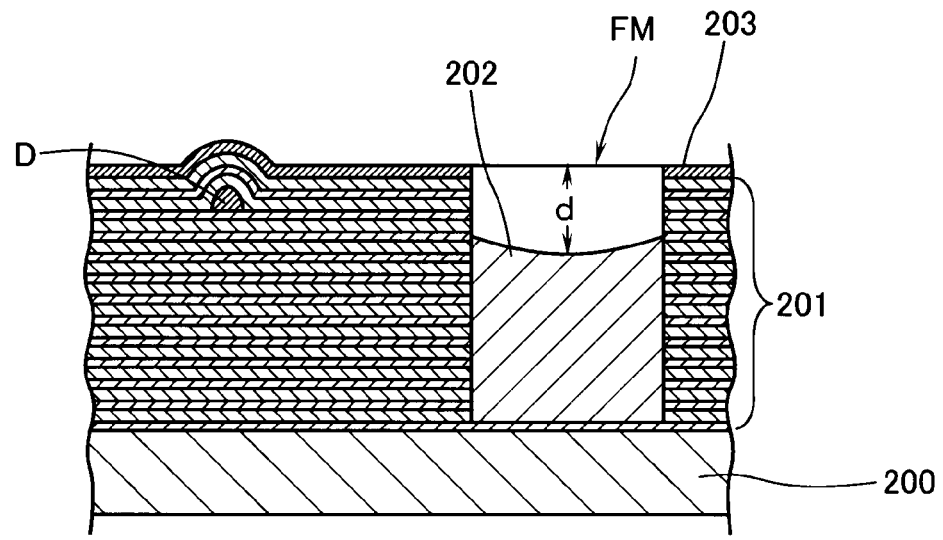
FIG. 2 is a schematically cross sectional view of a reference mark formed in a multilayer film included in a reflective mask.

The electron beam writing apparatus can be used to form a reflective mask that is used for EUV lithography. As shown in FIG. 2, a blank (mask blank) of the reflective mask is formed by laminating a multilayer film 201 on a low-thermal expansion substrate 200. Light is reflected on the multilayer film 201. The multilayer film 201 is formed by alternately laminating Si films and Mo films. The number of the films included in the multilayer film 201 is in a range of 40 to 50. The number of the films (included in the multilayer film 201) shown in FIG. 2 is smaller than the actual number of the films included in the multilayer film 201. A cap film 203 is formed on the multilayer film 201 and serves as a protective film for the multilayer film 201. The cap film 203 is made of a silicon film and has a thickness of 9 nm or less. A predetermined portion of the multilayer film 201 is irradiated with laser light to ensure that the Si and Mo films included in the irradiated portion are alloyed to form a MoSi film 202. The volume of the MoSi film 202 is smaller than the total volume of the irradiated Si films and the irradiated Mo films. Thus, the irradiated portion can be detected as a reference mark FM. The reference mark FM is recessed and has a depth d of 50 nm to 60 nm. The depth of the reference mark FM is a distance between the surface of the cap film 203 and the surface of the MoSi film 202. The reference mark FM has a roughness (edge roughness) on its edge. The edge roughness is caused by the formation of the reference mark FM. The reference mark FM serves as a reference for specifying the position of a phase defect D located in the multilayer film 201. In a process for inspecting an environmental contaminant in the mask blank shown in FIG. 2, the position of the phase defect D is specified on the basis of the position of the reference mark FM.

Figure 3:
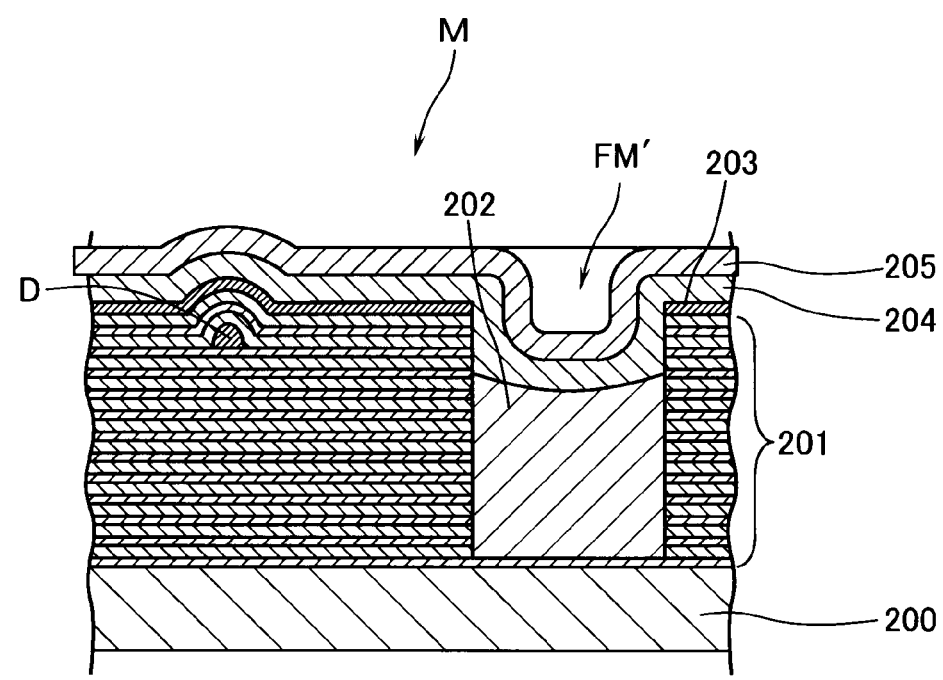
FIG. 3 is a schematically cross sectional view of the reference mark formed in the reflective mask.

The reflective mask M placed on the stage 11 (included in the electron beam writing apparatus) is formed as follows. An absorber (TaBN film) 204 is formed on the cap film 203 and has a thickness of 69 nm or less, and a resist 205 is formed on the absorber 204, as shown in FIG. 3. Extreme ultraviolet (EUV) light is not reflected on the absorber 204. It is necessary that the position of the center C of a concave-shaped reference mark FM' (shown in FIGS. 3 and 4) be detected in order to write a pattern and thereby cover the phase defect D with the absorber 204. The position of the center C of the reference mark FM' corresponds to the position of the center of the reference mark FM shown in FIG. 2.

Figure 4:
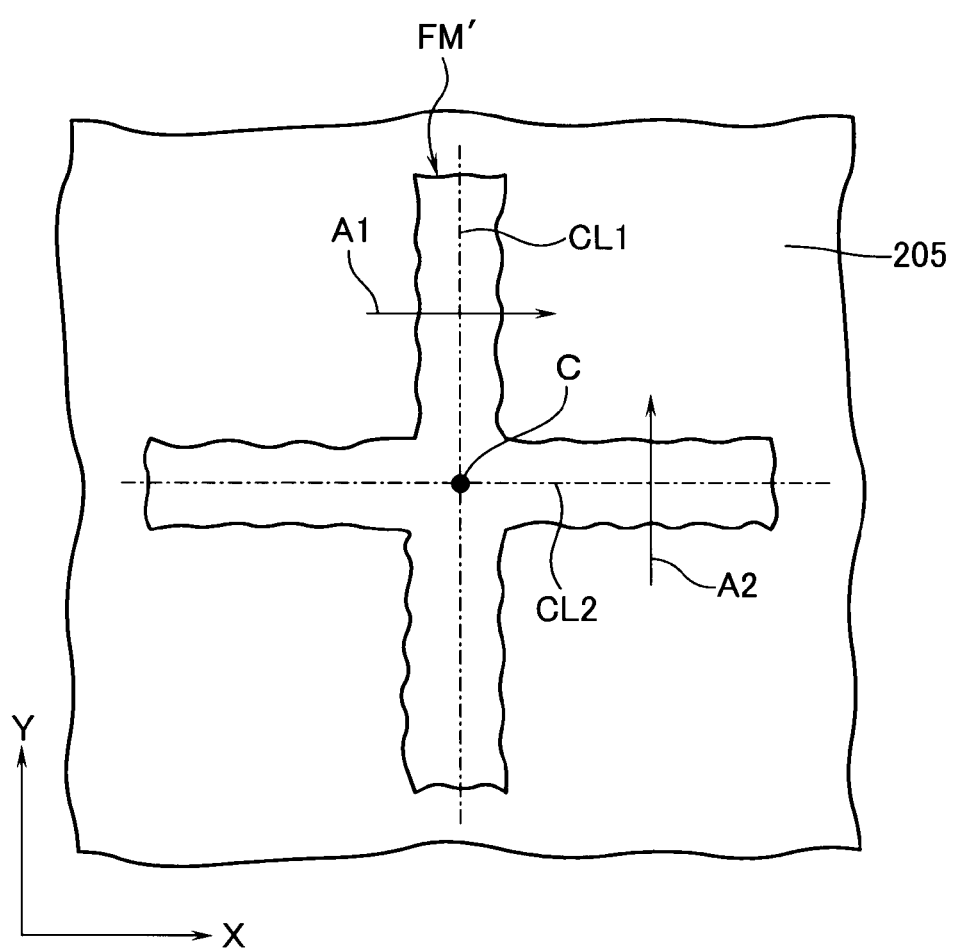
FIG. 4 is a plane view of the reference mark in FIG. 3.

In FIG. 4, the width and length of the reference mark FM' are not the actual width and length in order to easily understand the reference mark FM'. The reference mark FM' has a cross shape as shown in FIG. 4. The reference mark FM', however, may have a box shape.

Figure 5:
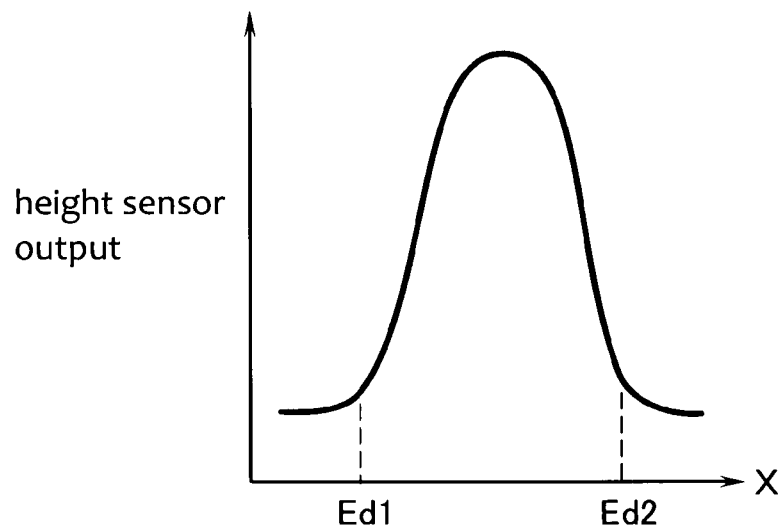
FIG. 5 shows a waveform of an output of Height sensor 14.

In the present embodiment, the stage 11 moves in the X direction along an arrow A1 shown in FIG. 4. The light emitting section 14a of the Height sensor 14 then emits the laser light LZ to capture the reference mark FM' by the stage being scanned. The light receiving section 14b then receives light reflected on the mask M. In this case, the movement speed of the stage 11 may be determined on the basis of at least one of the width of the reference mark FM' and a sampling period of the Height sensor 14. The sampling period is a period at which a change in the angle of light reflected on the mask M is detected. For example, when the width of the reference mark FM' is 4 µm and the sampling period is several ten seconds, the movement speed of the stage 11 may be in a range of 0.2 mm/sec to 0.3 mm/sec. Thus, the light receiving section 14b is capable of acquiring a waveform of the intensity of a signal output from the Height sensor, as shown in FIG. 5. In FIG. 5, the output signal intensity is rapidly changed at Ed1 and Ed2 that indicate respective positions in the X direction. The positions Ed1 and Ed2 in the X direction can be regarded as positions of edges of the reference mark FM'. The position of the stage 11 in the X direction, which is detected by the stage position detector 36 when the angle of the signal output from the Height sensor 14 is changed, can be detected as the position of the edge of the reference mark FM'. As shown in FIG. 4, a central line CL1 that extends on the center of the detected two edges is calculated.

The stage 11 moves in the Y direction along an arrow A2 shown in FIG. 4. The light emitting section 14a of the Height sensor 14 then emits the laser light LZ to capture the reference mark FM'. The light receiving section 14b then receives light reflected on the mask M. The position of the stage 11 in the Y direction, which is detected by the stage position detector 36 when the angle of the signal output by the Height sensor 14 is changed, is detected as the position of an edge of the reference mark FM'. As shown in FIG. 4, a central line CL2 that extends on the center of detected two edges is calculated.

An intersection of the central lines CL1 and CL2 is regarded as the position of the center C of the reference mark FM'.

Figure 6:
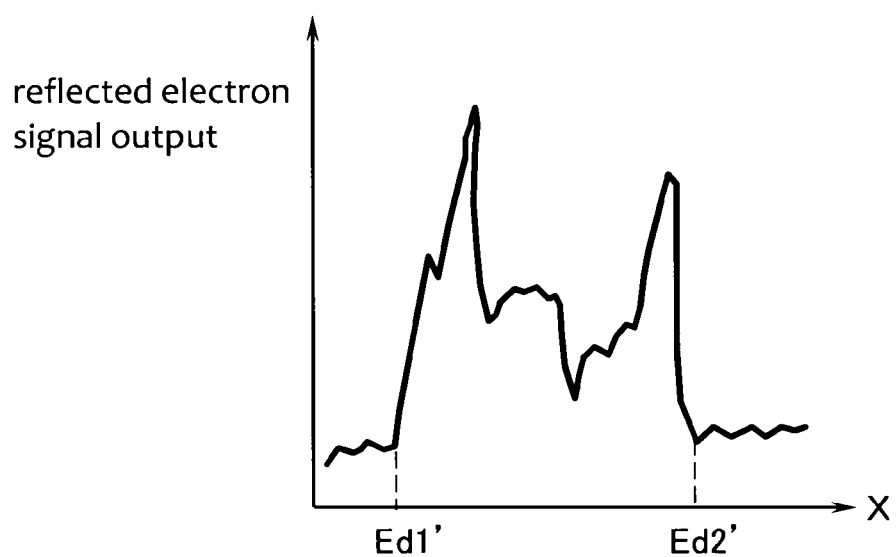
FIG. 6 is a graph showing a signal waveform of an electron reflected by scanning an electron beam.

Alternatively, the stage 11 is positioned near the reference mark FM'. The electron gun 21 then emits an electron beam B to scan the reference mark FM' along the arrow A1 shown in FIG. 4. The reflected electron detector 15 then detects an electron reflected on the mask M. The position of the center C of the reference mark FM' is then calculated on the basis of a signal waveform of the reflected electron. The signal waveform of the reflected electron is shown in FIG. 6. Positions Ed1' and Ed2', at which the intensity of the signal is changed, can be regarded as the positions of edges of the reference mark FM'. The diameter of the spot of the electron beam B is approximately 1 µm or smaller. In this method, when the electron gun 21 emits the electron beam B to scan the reference mark FM', the signal waveform of the reflected electron is affected by an edge roughness of the reference mark FM'. Thus, when the electron beam B is shifted from a portion that is to be scanned, the profile of the signal waveform of the reflected electron is changed. Therefore, the position of the edge of the reference mark FM' cannot be reproducibly detected. As a result, the position of the center C of the reference mark FM' cannot be reproducibly calculated in this method.

In the present embodiment, the position of the reference mark FM' is detected by the Height sensor 14 as described above. The diameter of the spot of the laser light LZ emitted by the Height sensor 14 is approximately several hundred micrometers and much larger than the diameter of the spot of the electron beam B. Thus, the laser light LZ is not affected by the edge roughness of the reference mark FM'. Even when the laser light LZ is slightly shifted from a portion that is to be scanned, the profile of the signal waveform is not changed. Thus, the position of the edge of the reference mark FM' can be reproducibly detected. As a result, the position of the center C of the reference mark FM' can be reproducibly calculated.

Figure 7:
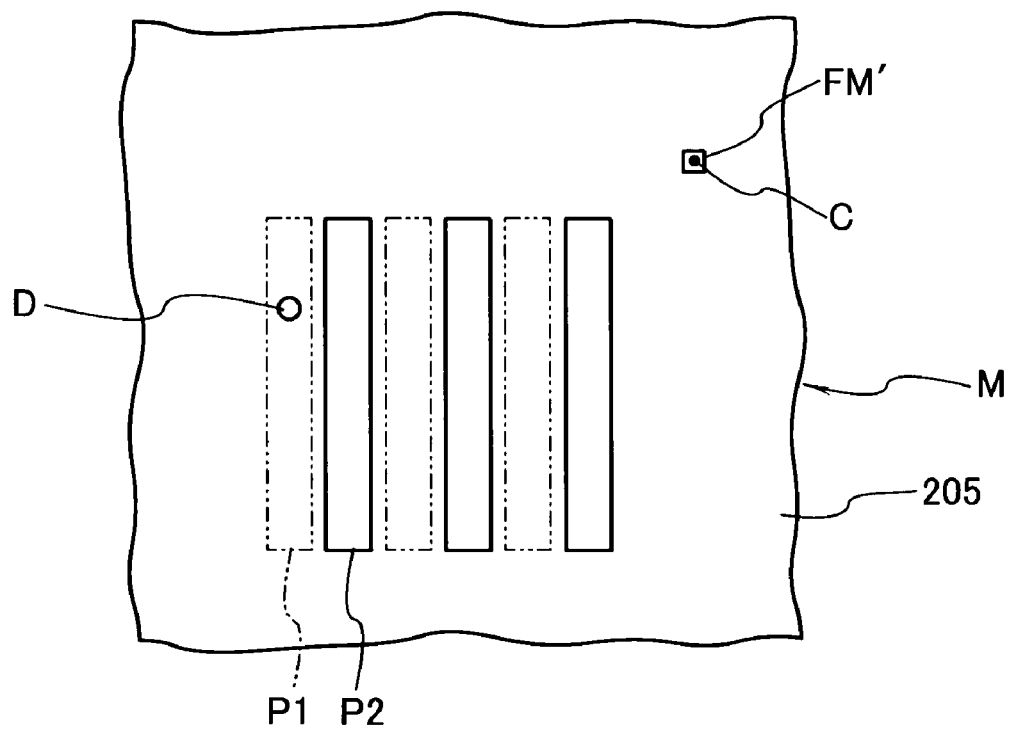
FIG. 7 is a schematic diagram explaining a method for determining, on the basis of the position of a defect, the position of a portion on which writing is to be performed.

After the position of the center C of the reference mark FM' is calculated, the position of the phase defect D located in the multilayer film is specified, as shown in FIG. 7. The position of the phase defect D is precalculated on the basis of a relationship with the position of the reference mark FM (refer to FIG. 2) in the process (performed before writing) for inspecting an environmental contaminant in the mask blank. The position of a portion on which writing is to be performed is determined on the basis of the relationship with the specified position of the phase defect D. Specifically, the position of a pattern is shifted from a position P1 to a position P2 to ensure that the phase defect D is covered with the absorber 204 subjected to an etching process. Thus, the position of the pattern that will be a hollow portion due to a development process (performed after the writing) is changed from the position P1 to the position P2. Thus, the phase defect D shown in FIG. 7 is covered with the resist 205 subjected to a development process. Therefore, the phase defect D is covered with the absorber 204 subjected to the etching process. As a result, the phase defect D located in the mask M is acceptable, and the yield of the mask M can be improved.

Figure 8:
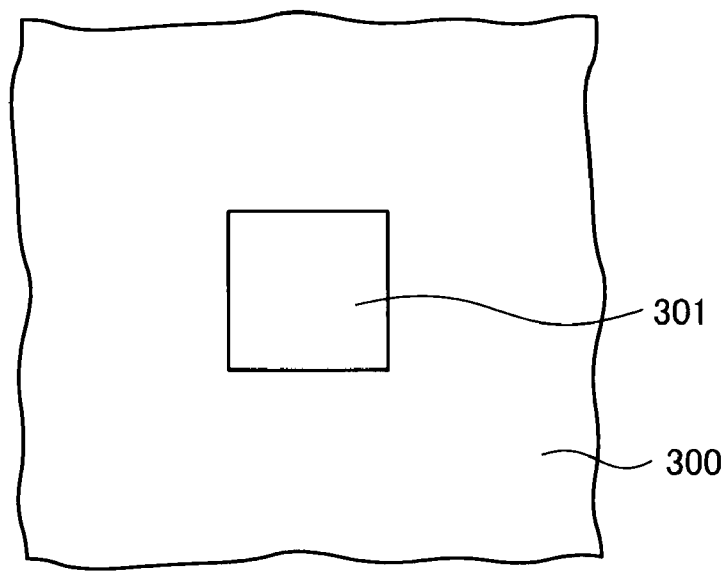
FIG. 8 shows a calibration pattern 301.

In the present embodiment, although the reference mark FM' has an edge roughness of several ten to several hundred µm, the Height sensor 14 is capable of reproducibly detecting the position of the reference mark FM'. Unlike the reference mark FM', a calibration pattern is used to calibrate the Height sensor 14 may be a pattern 301. The calibration pattern 301 is made of a heavy metal (such as tantalum or tungsten) and formed on a silicon substrate 300, as shown in FIG. 8. The calibration pattern 301 is typically formed by a semiconductor process such as a photolithography process or etching process. An edge roughness of the calibration pattern 301 formed by the semiconductor process is small, and the size of the edge roughness of the calibration pattern 301 is several nanometers. When the edge roughness of the calibration pattern 301 is small and the electron beam B having a high resolution is scanned over the calibration pattern 301, the position of the center of the calibration pattern 301 can be reproducibly detected. The substrate 300, on which the calibration pattern 301 is formed, is typically located in a region different from a region in which the mask M placed on the stage 11 is located. For example, the substrate 300 is located on an edge portion of the stage 11.

The position (X and Y coordinates) of the center of the calibration pattern 301 (that has the small edge roughness and is formed by the semiconductor process) is detected on the basis of a first signal waveform obtained by causing the Height sensor 14 to emit laser light LZ so as to capture the pattern 301. In addition, the position (X and Y coordinates) of the center of the calibration pattern 301 is detected on the basis of a second signal waveform of a reflected electron obtained by causing the electron gun 21 to emit the electron beam B so as to scan the pattern 301. Differences between the X and Y coordinates detected on the basis of the first signal waveform and the X and Y coordinates detected on the basis of the second signal waveform are calculated and stored in the storage device 39. The differences are added to the position (X and Y coordinates) of the center C of the reference mark FM'. Thus, the coordinates of the position of the center of the reference mark FM' can be reproducibly calculated on the basis of the signal obtained by scanning the electron beam B. The position of the phase defect D can be accurately specified. Therefore, the position (coordinates of the center) of a pattern written using a charged particle beam can be accurately shifted.

The calibration pattern 301 has a box shape as shown in FIG. 8. The calibration pattern 301, however, may have a cross shape or the like. In a way similar to the method for calculating the position of the center of the reference mark FM', an intersection of two central lines can be regarded as the position of the center of the calibration pattern 301.

When the position of an object (to be measured) in a height is changed, the light receiving section 14b receives light at a different location. Thus, the Height sensor 14 detects the height position of the object (to be measured). In order to calculate differences between the coordinates (of the center of the calibration pattern 301 having the small edge roughness) calculated by scanning the electron beam B and the coordinates (of the center of the calibration pattern 301 having the small edge roughness) calculated by the Height sensor 14, the height position of the surface of the mask M (in which the reference mark FM' is formed) coincides ideally with the height position of the surface of the calibration pattern 301. It should be noted that the height position of the surface of the mask M varies for each mask.

Figure 9:
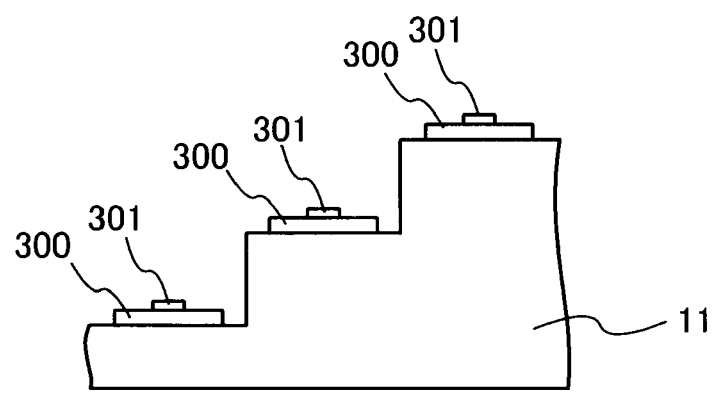
FIG. 9 is a diagram of a calibration pattern 301 that is formed on a stage and includes steps having heights different from each other.
Figure 10:
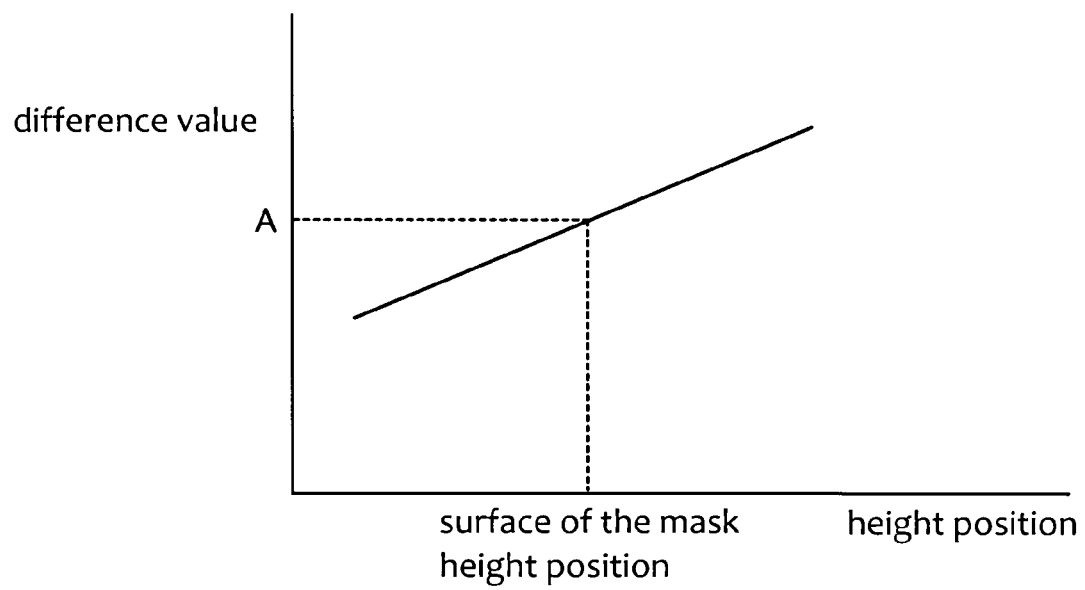
FIG. 10 is a graph showing a relationship between the height position of a surface of the calibration pattern and a difference between the position (calculated by scanning an electron beam) of the center of the calibration pattern and the position (calculated by means of a Height sensor) of the center of the calibration pattern.

Referring to FIG. 9, the edge portion of the stage 11 has steps. The substrates 300, on which the calibration patterns 301 are formed, are fixed to the steps (e.g., three steps). The positions (height positions) of the surfaces of the calibration patterns 301 are different from each other. Then, the positions (X and Y coordinates) of the centers of the calibration patterns 301 are calculated by scanning the electron beam B. After that, the height positions of the surfaces of the calibration patterns 301 are measured by the Height sensor 14. In addition, the positions (X and Y coordinates) of the centers of the calibration patterns 301 are calculated by the Height sensor 14. Differences between the X and Y coordinates calculated by scanning the electron beam B and the X and Y coordinates calculated by the Height sensor 14 are calculated. The relative relationship between the differences and the height positions of the surfaces of the calibration patterns 301 is obtained as shown in FIG. 10. The relative relationship is obtained for the X coordinates and for the Y coordinates. The position (height position) of the surface of the mask M is measured by the Height sensor 14. A difference value A corresponding to the measured height position of the surface of the mask M is calculated in accordance with the relative relationship. The obtained difference value A is added to the position of the center of the reference mark FM'. The addition of the difference value A is performed by a reference mark position detector 38 for the X coordinates and for the Y coordinates. In this way, a difference value corresponding to the height position of the surface of the mask M is added for writing. Thus, the position of a portion on which writing is to be performed can be accurately determined (shifted).

The present invention is not limited to the aforementioned embodiment. Various changes and modifications can be made without departing from the gist of the present invention. The pattern is written using the electron beam B in the aforementioned embodiment. The present invention is not limited to this. The present invention is applicable to a pattern that is written using another charged particle beam such as an ion beam.

In the embodiment, the precalculated differences are stored in the storage device 39. The electron beam writing apparatus may receive data indicative of the differences from an external device, and add the differences to the position (X and Y coordinates) of the center C of the reference mark FM'. In addition, the plurality of calibration patterns 301 is placed on the stage 11, while the height positions of the surfaces of the calibration patterns 301 are different from each other. However, the plurality of calibration patterns 301 are not necessarily placed. The stage 11 may move in the Z direction. When the stage 11 is capable of moving in the Z direction, the height positions of the surfaces of the calibration patterns 301 in the Z direction can be changed by causing the stage 11 to move in the Z direction. The differences can be calculated for each of the patterns 301 (having the surfaces whose height positions are different from each other) by the aforementioned method.

In the aforementioned embodiment, the position of the concave-shaped reference mark is detected. The shape of the reference mark is not limited to the concave shape. The present invention is applicable to a reference mark having steps. That is, the position of the reference mark having the steps may be detected.

The features and advantages of the present invention may be summarized as follows.

According to first and second aspects of the present invention, an optical lever type height position sensor emits light to capture a reference mark that has steps and is formed on a sample, while a charged particle beam is not used to scan the reference mark. The position (X and Y coordinates) of a stage which is positioned when the angle of light reflected on the sample is changed is detected. The detected position of the stage is regarded as the position of the reference mark. Thus, the position of the reference mark can be reproducibly detected without an influence of an edge roughness of the reference mark. When the position of a defect located in the sample can be detected on the basis of the detected position of the reference mark, the position of the center of a pattern to be written can be shifted to ensure that the defect is covered with an absorber film that serves as a light shielding body.

According to a third aspect of the present invention, the sample placed on the stage is irradiated with light, and the angle of the light reflected on the sample is detected. The stage moves in the X and Y directions. The position (X and Y coordinates) of the stage, which is detected when the angle of the reflected light is changed, is detected as a reference position. Thus, the reference position for writing can be reproducibly detected without an influence of an edge roughness of the pattern.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-067030, filed on Mar. 18, 2009 including specification, claims, drawings and summary, on which the Convention priority of the present application is based, are incorporated herein by reference in its entirety.

What is claimed is:

1. A charged particle beam writing method comprising:
    moving a stage in X and Y directions;
    scanning the stage against light emitted by an optical lever type height position sensor over a reference mark that has steps and is formed in a sample placed on the stage;
    detecting a change in the angle of light reflected on the sample;
    detecting X and Y coordinates of the position of the stage positioned when the angle of the reflected light is changed;
    calculating the position of the reference mark on the basis of the detected positional coordinates;
    specifying, on the basis of the calculated position of the reference mark, the position of a defect located in the sample; and
    determining, on the basis of a relationship with the specified position of the defect, the position of a portion on which writing is to be performed.

2. The charged particle beam writing method according to claim 1, further comprising:
    determining the movement speed of the stage on the basis of at least one of the width of the reference mark and a period at which a change in the angle of light reflected on the sample is detected.

3. The charged particle beam writing method according to claim 1, further comprising:
    calculating a central line extending on the center of the detected two X coordinates and a central line extending on the center of the detected two Y coordinates; and
    regarding an intersection of the central lines as the position of the reference mark.

4. The charged particle beam writing method according to claim 1, wherein
    the light used to scan the reference mark is laser light to detect the position of the reference mark.

5. The charged particle beam writing method according to claim 1, further comprising:
    calculating, on the basis of a signal waveform of an electron reflected by scanning a charged particle beam over a calibration pattern with a charged particle beam, first X and Y coordinates of the position of the calibration pattern that is located on the stage and used to calibrate the height position sensor;
    calculating second X and Y coordinates of the position of the calibration pattern on the basis of a change in the angle of the light reflected when the light is scanned over the calibration pattern by the movement of the stage in the X and Y directions;
    calculating differences between the first X and Y coordinates and the second X and Y coordinates; and
    adding the calculated differences to the detected X and Y coordinates of the reference mark.

6. The charged particle beam writing method according to claim 5, further comprising:
    when the calibration pattern has surfaces whose height positions are different from each other, calculating differences between the first X and Y coordinates of the position of each surface of the calibration pattern and the second X and Y coordinates of the position of each surface of the calibration pattern, the first X and Y coordinates being calculated on the basis of the signal waveform of the electron reflected when the charged particle beam is scanned over the calibration pattern, the second X and Y coordinates being calculated on the basis of the change in the angle of the light reflected when the light is scanned over the calibration pattern;
    measuring the height position of the surface of the sample by means of the height position sensor; and
    adding, to the detected X and Y coordinates of the position of the reference mark, the differences between the first X and Y coordinates of the position of the surface of the calibration pattern having the surface whose height position is the same as the height position of the surface of the sample and the second X and Y coordinates of the position of the surface of the calibration pattern having the surface whose height position is the same as the height position of the surface of the sample.

* * * * *